US 6,465,343 B1

(12) United States Patent
Wang

(10) Patent No.: US 6,465,343 B1
(45) Date of Patent: Oct. 15, 2002

(54) METHOD FOR FORMING BACKEND INTERCONNECT WITH COPPER ETCHING AND ULTRA LOW-K DIELECTRIC MATERIALS

(75) Inventor: Fei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/793,986

(22) Filed: Feb. 28, 2001

(51) Int. Cl.[7] .......................................... H01L 21/4763
(52) U.S. Cl. ..................... 438/624; 438/626; 438/637; 438/656; 438/687; 438/706
(58) Field of Search ................. 438/637, 687, 438/624, 625, 622, 648, 626, 656, 706

(56) References Cited

U.S. PATENT DOCUMENTS

| | | | | | |
|---|---|---|---|---|---|
| 4,931,410 A | * | 6/1990 | Tokunaga etal. | ............ | 437/189 |
| 5,668,398 A | * | 9/1997 | Havemann et al. | ......... | 257/522 |
| 5,858,869 A | * | 1/1999 | Chen et al. | ................. | 438/597 |
| 5,916,823 A | * | 6/1999 | Lou et al. | .................... | 438/738 |
| 6,020,269 A | * | 2/2000 | Wang et al. | ................. | 438/717 |
| 6,054,379 A | * | 4/2000 | Yau et al. | .................... | 438/623 |
| 6,057,226 A | * | 5/2000 | Wong | .......................... | 438/623 |
| 6,080,529 A | * | 6/2000 | Ye et al. | ...................... | 430/318 |
| 6,153,528 A | * | 11/2000 | Lan | .............................. | 438/697 |
| 6,159,842 A | * | 12/2000 | Chang et al. | ............... | 438/622 |
| 6,162,583 A | * | 12/2000 | Yang et al. | ................. | 430/313 |
| 6,187,672 B1 | * | 2/2001 | Zhao et al. | ................. | 438/639 |
| 6,355,572 B1 | * | 3/2002 | Ikegami | ..................... | 438/706 |

OTHER PUBLICATIONS

S.-P. Jeng et al., "Highly Porous Interlayer Dielectric for Interconnect Capacitance Reduction," 1995 Symposium on VLSI Technology Digest of Technical Papers, Jun. 1995, pp. 61–62.*

* cited by examiner

Primary Examiner—Olik Chaudhuri
Assistant Examiner—Stephen W. Smoot

(57) ABSTRACT

A method for forming a metal interconnect structure provides a copper conductive layer which is etched to form conductive lines. A low k dielectric material is provided in the spaces formed between the copper lines. Since any photoresist material that was previously used in forming the copper lines is removed prior to the deposition of the low k dielectric materials between the lines, this low k dielectric layer is not subjected to a photoresist removal process. Sidewall damage low k dielectric material is thereby avoided so that line-to-line capacitance in the metal interconnect structure is not compromised.

12 Claims, 5 Drawing Sheets

METHOD FOR FORMING BACKEND INTERCONNECT WITH COPPER ETCHING AND ULTRA LOW-K DIELECTRIC MATERIALS

FIELD OF THE INVENTION

The present invention relates to the formation of metal interconnection layers during the manufacture of semiconductor devices, and more particularly to the formation of a backend interconnect using copper and ultra low k material.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance interconnection pattern, particularly where sub-micron via contacts and trenches have high aspects ratios imposed by miniaturization.

Conventional semiconductor devices typically comprise a semiconductor substrate, normally of doped monocrystalline silicon, made from a plurality of sequentially formed dielectric layers and conductive patterns. An integrated circuit is formed containing a plurality of conductive patterns comprising conductive lines separated by inter-wiring spacing. Typically, the conductive patterns on different layers, i.e., upper and lower layers, are electrically connected by a conductive plug filling a via hole, while a conductive plug filling a contact hole establishes electrical contact with an active region on a semiconductive substrate, such as a source/drain region. Conductive lines are formed in trenches which typically extend substantially horizontal with respect to the semiconductor substrate. Semiconductor chips comprising five or more levels of metalization are becoming more prevalent as device geometries shrink to sub-micron levels.

A conductive plug filling a via hole is typically formed by depositing a dielectric interlayer on a conductive layer comprising at least one conductive pattern, forming an opening in the dielectric layer by conventional photolithographic and etching techniques, and filling the opening with a conductive material, such as tungsten (W). Excess conductive material on the surface of the dielectric layer is typically removed by chemical mechanical polishing (CMP). One such method is known as damascene and basically involves forming an opening in the dielectric layer and filling the opening with a metal. Dual damascene techniques involve forming an opening comprising a lower contact or via hole section in communication with an upper trench section, which opening is filled with conductive material, typically a metal, to simultaneously form a conductive plug and electrical contact with a conductive line.

In prior technologies, aluminum was used in very large scale integration interconnect metalization. Copper and copper alloys have received considerable attention as a candidate for replacing aluminum in these metalizations. Copper has a lower resistivity than aluminum and improved electrical properties compared to tungsten, making copper a desirable metal for use as a conductive plug as well as conductive wiring.

In other efforts to improve the operating performance of a chip, low k dielectric materials have been increasingly investigated for use as a replacement for dielectric materials with higher k values. Lowering the overall k values of the dielectric layers employed in the metal interconnect layers lowers the RC of the chip and improves its performance. However, low k materials, such as benzocyclobutene (BCB), hydrogen silsesquioxane (HSQ), SiOF, etc., are often more difficult to handle than traditionally employed higher k materials, such as an oxide. For example, inorganic low k dielectric materials are readily damaged by techniques used to removed photoresist materials after the patterning of a layer. Hence, a feature formed in an inorganic low k dielectric layer may be damaged when the photoresist layer used to form the trench is removed. Damage to the low k dielectric layer is especially critical in the layers containing conductive lines, and not as critical in layers containing the conductive plugs. This is due to the importance of the line-to-line capacitance being maintained as low as possible to improve the device performance.

There is therefore a need to provide a method for performing a backend interconnect using low k or ultra low k electric materials with copper lines, but without causing the damage to the sidewalls normally created by the photoresist removal process.

SUMMARY OF THE INVENTION

These and other needs are met by embodiments of the present invention which provide a method of forming a metal interconnect structure comprising the steps of etching a conductive layer to form conductive lines with spaces between the lines such that all photoresist material is removed during the etching of the conductive layer. The spaces between the conductive lines are filled with low k dielectric material. A polish layer is then deposited over the low k dielectric material and polished. Via holes are etched through the polish layer into the low k dielectric layer. The via holes are aligned over the conductive lines.

By etching the conductive layer to form conductive lines and spaces between the lines, removing all the photoresist material during this etching process, and subsequently filling the spaces between the conductive lines with low k dielectric material, it can be assured that the low k dielectric material between the conductive lines is not subjected to a photoresist removal process. Hence, the low k dielectric material is not degraded by exposure to the photoresist removal process. In certain embodiments of the invention, the conductive material is copper. In these embodiments, an advantageous method of etching the copper to form the conductive lines with the spaces therebetween is employed. With the spaces formed between the conductive copper lines, the photoresist material may be removed prior to filling the spaces with the low k dielectric material. The sequence of processing steps improves the structural integrity of the low k dielectric layer.

The earlier stated needs are also met by another aspect of the present invention which provides a method of forming a backend interconnect. This method comprises the steps of etching a copper layer to form copper lines with spaces between the copper lines. Low k dielectric material is formed in the spaces and over the copper lines. Via holes are etched in the low k dielectric layer above the copper lines, while preventing the low k dielectric material on the spaces from exposure to photoresist removal processes. The via holes are then filled with copper.

Although the present invention has been described and illustrated in detail, it is to be clearly understood that the same is by way of illustration and example only and is not to be taken by way of limitation, the scope of the present invention being limited only by the terms of the appended claims.

DETAILED DESCRIPTION OF THE INVENTION

The present invention addresses and solves problems related to the prevention of damage to a low k dielectric layer during resist strip processes. The problems are substantially solved by the present invention, in part, by performing an etch of a copper layer to form copper lines, with spaces being formed between the copper lines. These spaces are filled by low k material. Since the low k material has not been etched to form trenches in which copper is deposited to form the copper lines, the low k dielectric material does not have trenches that have been exposed to a photoresist removal process. Hence, the low k dielectric material present between the conductive copper lines remains free of photoresist removal process damage.

Figure 1A:
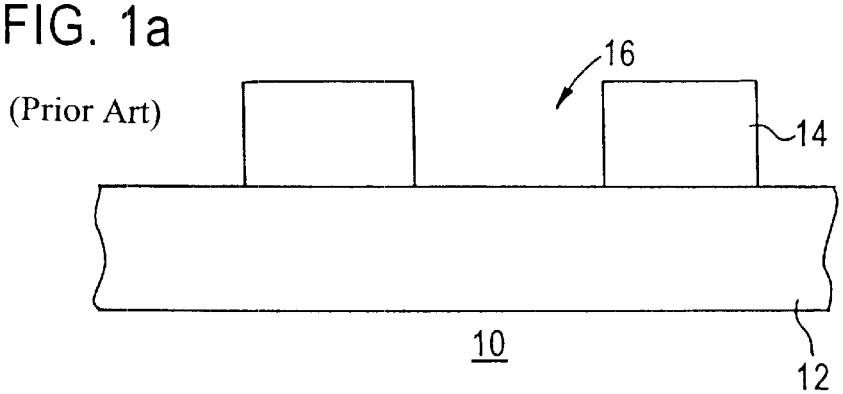
FIGS. 1a–1d depict a cross-section of a portion of a metal interconnect structure constructed in accordance with prior art methodology, exhibiting sidewall image to the low k dielectric material.

FIGS. 1a–1d depict a cross-section of a metal interconnect portion constructed in accordance with prior art methodology. In FIG. 1a, a low k dielectric layer 12 is provided on a substrate 10. The low k dielectric layer, or ultra low k dielectric layer, can be any of a number of different types of materials, such as organic or inorganic low k dielectric materials known to those of ordinary skill in the art.

A trench mask 14 is deposited on the top surface of the low k dielectric layer 12 and patterned. The trench mask 14, after patterning, has a number of spaces 16 divided between the photoresist areas in the mask 14.

Figure 1B:
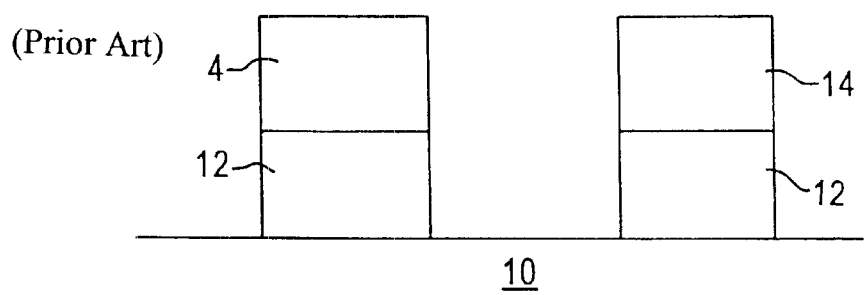

FIG. 1b depicts the portion of FIG. 1a after an etching has been performed to etch the low k dielectric 12 in accordance with the pattern provided in the trench mask 14. Suitable etching chemistries are known to those of ordinary skill in the art to etch the low k dielectric layer. The areas of the low k dielectric layer 12 underneath the remaining photoresist portions of the trench mask 14 are protected during the etching process.

Figure 1C:
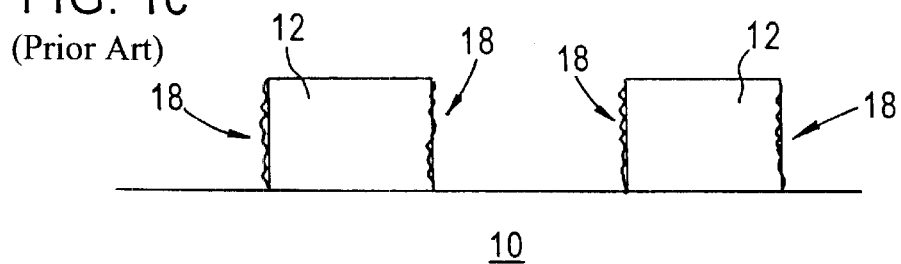
Figure 1D:
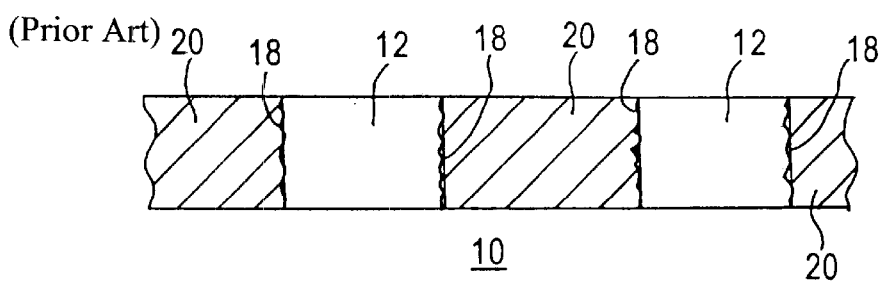

On removal of the photoresist material in the trench mask 14, in FIG. 1c, low k dielectric material 12 is damaged. This sidewall damage 18 is caused by the exposure of the low k dielectric material to an oxygen ashing process typically used in photoresist removal. FIG. 1d depicts the portion of FIG. 1c after copper has been deposited (following deposition of a barrier layer and a seed layer, not shown) to form conductive lines 20 separated by a low k dielectric material 12. Since the low k dielectric material 12 provided in the spaces between the conductive lines 20 exhibits sidewall damage 18, the line-to-line capacitance in this metalization layer adversely affected.

Figure 2:
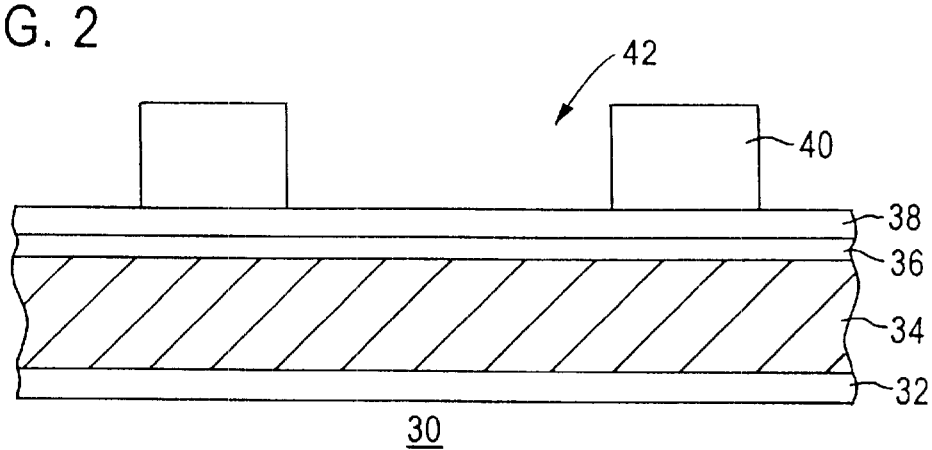
FIG. 2 is a cross-section of a portion of a metal interconnect structure at a stage of formation in accordance with embodiments of the present invention.

FIG. 2 depicts a portion of a metal interconnect region during one step of the interconnect formation process in accordance with embodiments of the present invention. As will be appreciated by this description, the present invention performs an etching of a copper layer to create copper lines, and then fills the spaces between the copper lines with low k dielectric material. This is in contrast to the prior art methodology of FIGS. 1a–1d in which etching of the low k dielectric layer is performed, with copper then being filled in between the low k dielectric material regions. As will be appreciated, there is no photoresist removal process damage to the low k dielectric material provided in the spaces between the conductive copper lines in accordance with the present invention.

In FIG. 2, a stop layer 32 is formed on a substrate 30. Stop layer 32 may be a metal layer, such as tantalum or tantalum nitride, for example. Such a layer may be formed to a thickness of approximately 0 to approximately 2000 Å. A conventional deposition technique, such a physical vapor deposition, may be employed to deposit the bottom stop layer 32. A conductive layer 34 is provided on the bottom stop layer 32. The conductive layer 34 may comprise copper or a copper alloy, for example. Copper or a copper alloy is the preferred conductive material for the layer 34, for the reasons expressed earlier regarding the advantages provided by copper over other conductive materials such as aluminum. A conventional deposition technique for providing the conductive layer 34 is employed.

A top stop layer 36 that serves to protect the conductive layer 34 is deposited on top of the conductive layer 34. An exemplary material for the top stop layer 36 is tantalum or tantalum nitride. An exemplary thickness of the top stop layer 36 is between approximately 0 Å and approximately 2000 Å. An exemplary thickness of the conductive layer 34 is between approximately 500 Å and approximately 20,000 Å.

A hard mask layer 38 is provided on top of the top stop layer 36. The hard mask layer 38 may be made of an oxide material, for example. A photoresist material provided to form a trench mask layer 40 has been deposited and patterned in accordance with the desired conductive line pattern. The spaces 42 between the photoresist material in the photoresist layer 40 corresponds to the spaces that will be formed between the conductive lines that are created by the etching of the conductive material.

Figure 3:
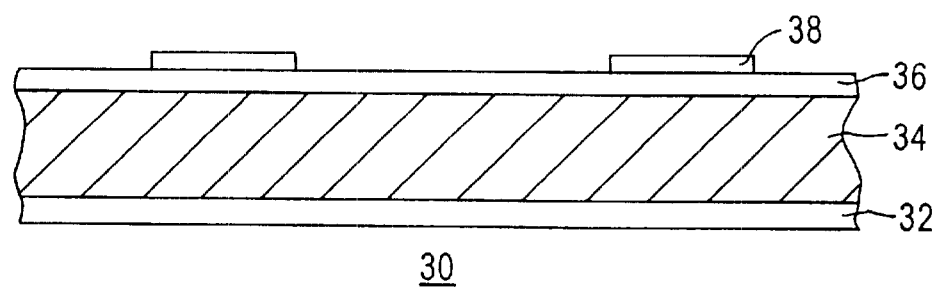
FIG. 3 depicts the portion of FIG. 2 after a hard mask is etched in accordance with embodiments of the present invention.

FIG. 3 depicts the metal interconnect portion of FIG. 2 following the etching of the hard mask 38 to transfer the pattern 42 from the trench mask layer 40 into the hard mask layer 38. A suitable etchant to etch the hard mask 38 and stop on the top stop layer 36, when the hard mask layer 38 is an oxide, for example, and the top stop layer is tantalum or tantalum nitride, for example, is $C_4F_8$/Ar. Following the etching of the hard mask layer 38, the trench mask layer 40 is removed by conventional oxygen ashing technique or other photoresist removal process. The conductive material in the conductive layer 34, such as copper, is protected from any contamination caused by the photoresist removal process by the top stop layer 36.

Figure 4:
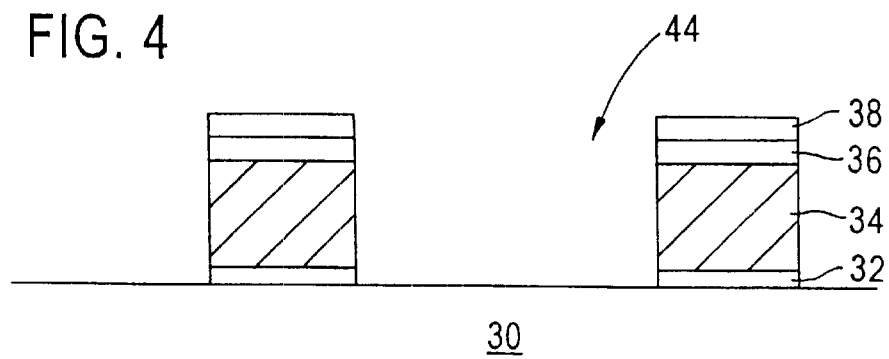
FIG. 4 depicts the portion of FIG. 3 following etching through an oxide mask to form conductive lines in accordance with embodiments of the present invention.

FIG. 4 depicts the creation of the copper lines by etching through the hard mask 38, the top stop layer 36, the conductive layer 34, and the bottom stop layer 32. A suitable etchant, when the conductive material is copper, is $Cl_2$/$BCl_3$, with this etching being performed at high temperatures, such as 250° C. or higher. Hence, the present invention takes advantage of recent advances in copper etching that allows copper lines to be etched. A space 44 is thereby provided between the copper lines 34.

Figure 5:
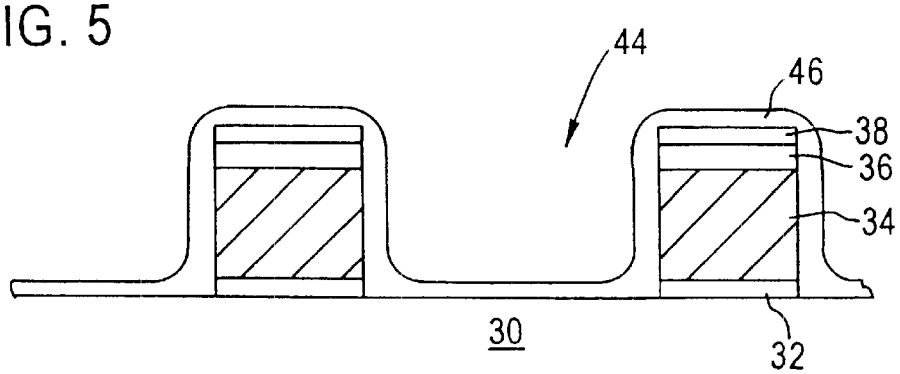
FIG. 5 shows the portion of FIG. 4 after a layer of diffusion barrier material has been deposited over the conductive lines and the substrate in accordance with the embodiments of the present invention.

In FIG. 5, a copper diffusion barrier material, such as silicon nitride (SiN) or silicon carbide (SiC), is deposited in a diffusion barrier layer 46 over the line structures and substrate 30. The diffusion barrier material in the diffusion barrier layer 46 serves to prevent the diffusion of the copper in the conductive layer 34 into the low k dielectric material that will be subsequently deposited. Deposition of the diffusion barrier material may be by any conventional methodology, such as chemical vapor deposition or physical vapor deposition, for example.

Figure 6:
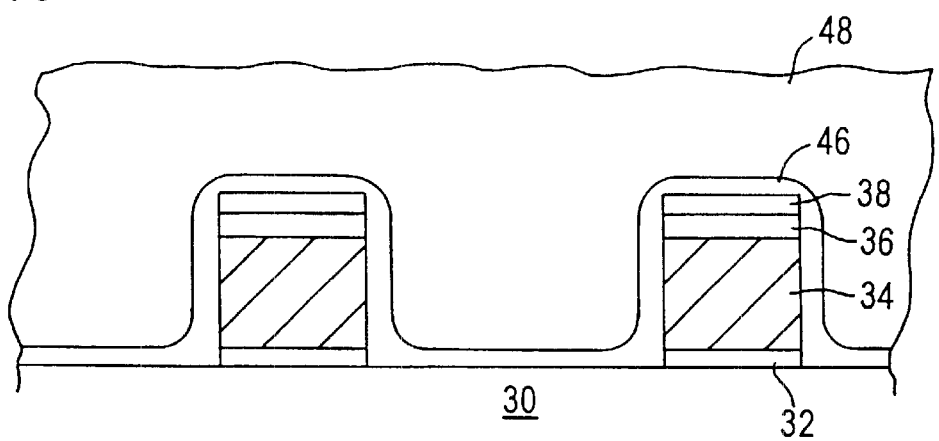
FIG. 6 depicts the portion of FIG. 5 after low k material has been deposited in accordance with embodiments of the present invention.

As shown in FIG. 6, a low k or ultra low k dielectric layer 48 is then provided in the spaces 44 between the conductive lines. The low k material or ultra low k material (hereinafter collectively referred to as low k material) may be any of a number of different types of low k materials. These include porous low k materials, nano-glass, SILK, for example. An ultra low k dielectric material is defined as material with a k less than or equal to approximately 2.5. It is necessary for the low k material in the low k dielectric layer 48 to have good filling characteristics, in other words, provide good step coverage within the spaces 44 between the conductive lines. Hence, the spaces 44 between the conductive lines will be completely filled with the low k dielectric material in the low k dielectric layer 48. The formation of the low k dielectric layer 48 may be accomplished by conventional methodologies well understood by those of ordinary skill in the art, such as spinning on the material.

Figure 7:
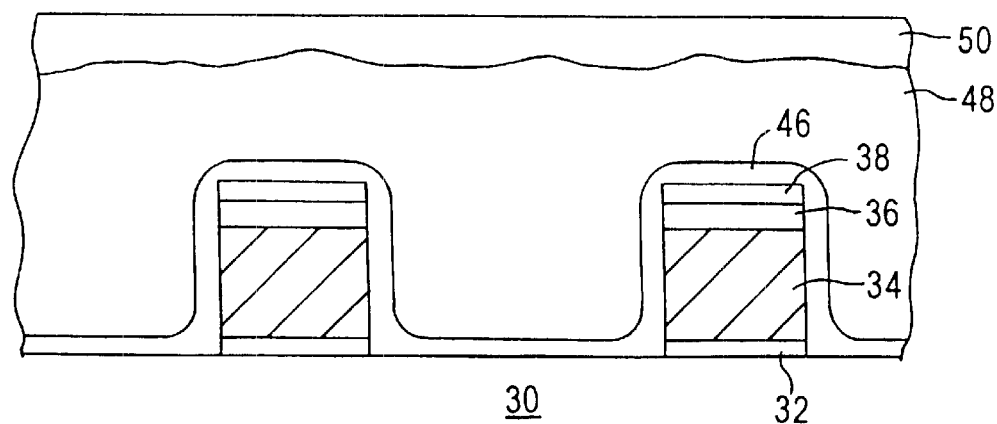
FIG. 7 shows the portion of FIG. 6 after a polish layer has been deposited over the low k dielectric material and polished.

In FIG. 7, oxide layer 50 has been deposited for CMP purpose to achieve a better planarization without damaging the underlayer low k dielectric layer. The oxide layer 50 is a relatively thin layer, such as between approximately 0 and approximately 10,000 Å.

Figure 8:
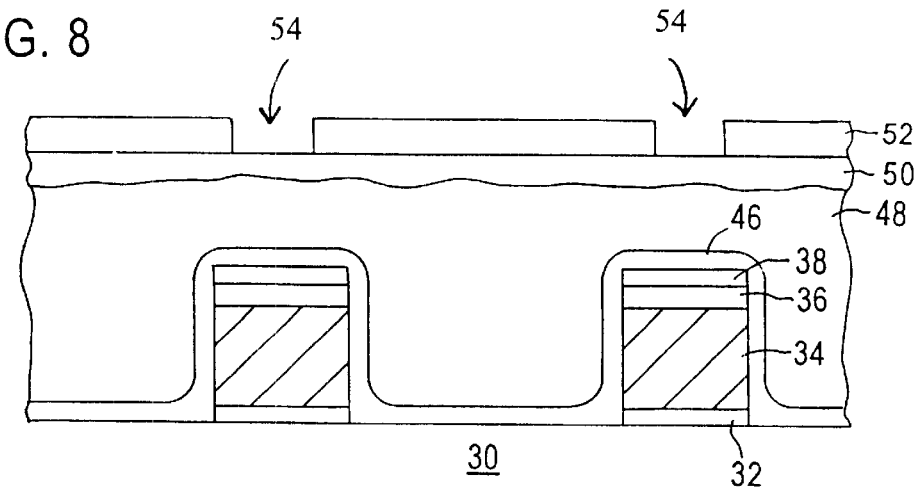
FIG. 8 depicts the portion of FIG. 7 after a via mask layer has been formed on the polish layer, in accordance with embodiments of the present invention.

A mask made of photoresist material 52 is then deposited and patterned on the oxide layer 50 (FIG. 8). A number of openings 54 are provided in the mask layer 52. These openings 54 will correspond to the vias that will be formed in the low k dielectric layer.

Figure 9:
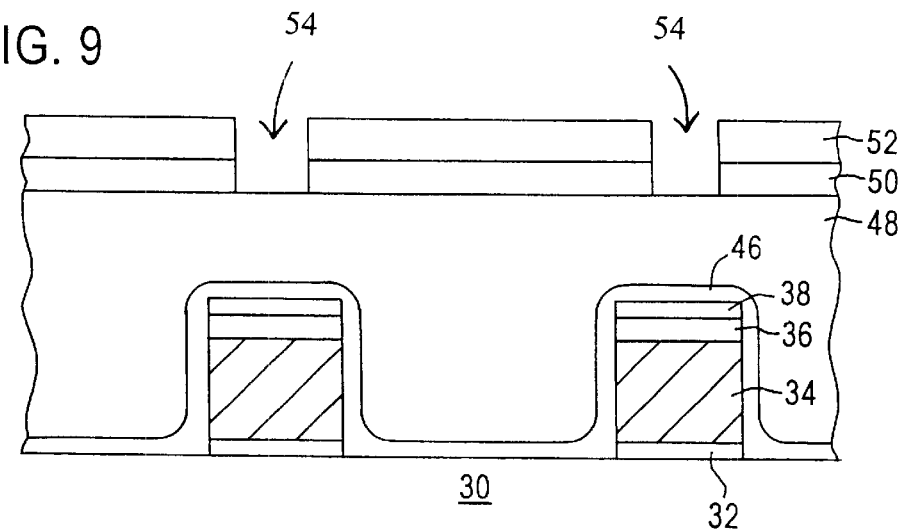
FIG. 9 depicts a portion of FIG. 8 after vias have been etched through the polish layer in accordance with the embodiments of the present invention.

In FIG. 9, the oxide layer 50 is etched to transfer the pattern 54 in the mask layer 52 to the oxide layer 50, which thus acts as a hard mask. An etchant used to etch the polish layer 50, now the hard mask layer 50, and stop on the low k dielectric layer 48 is $C_4F_8$/Ar, for example.

Figure 10:
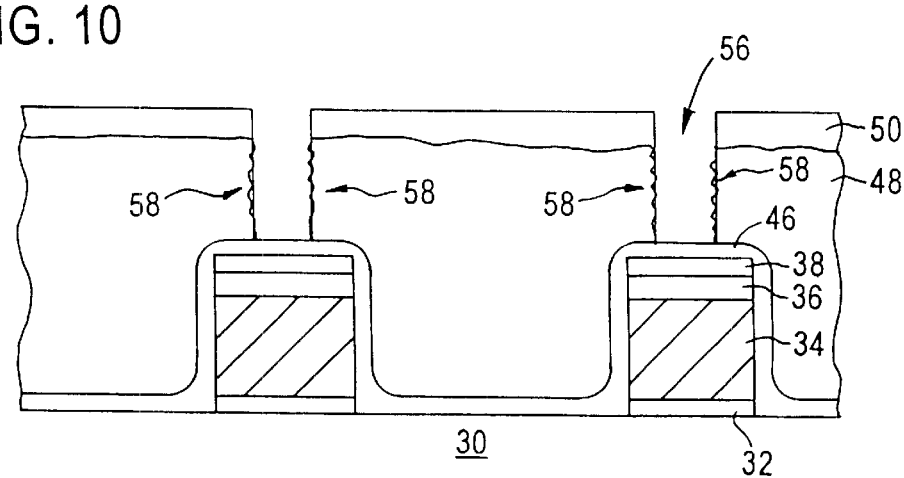
FIG. 10 depicts the structure of FIG. 9 following removal of the photoresist in accordance with embodiments of the present invention.

With the hard mask layer 50 etched, the low k dielectric layer 48 is now etched (FIG. 10) to form via holes 56 in the low k dielectric layer 48. The photoresist material in the via mask layer 52 is removed at the same time. Some sidewall damage 58 may be created on the via hole 56 during this process. However, since the damage is limited to the low k dielectric material in the via hole layer, no damage is inflicted on the low k dielectric material located between the conductive lines. Hence, the line-to-line capacitance is not adversely affected by the photoresist removal process. The damage to the sidewalls of the vias thus does not have as important an impact upon the overall operation of the circuit line-to-line capacitance.

Figure 11:
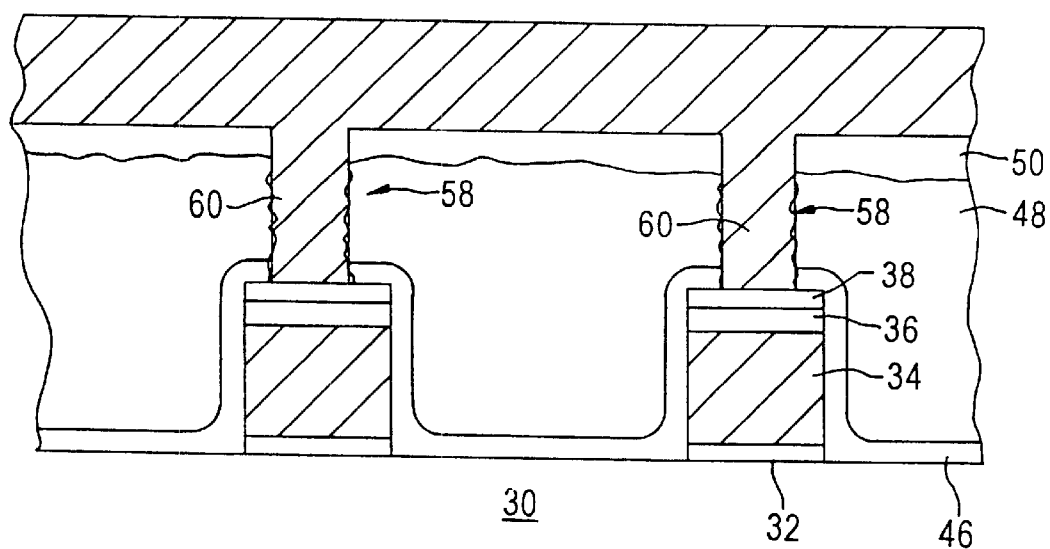
FIG. 11 depicts the structure of FIG. 10 following the deposition of a conductive material in accordance with the embodiments of the present invention.

In FIG. 11, the oxide of the polish stop layer 38 on the conductive line is removed to expose the layer 36. As seen in FIG. 11, a conductive material, such as copper or a copper alloy, is deposited to form the conductive plugs or contact 60. Since the sidewall damage 58 is confined by the methodology of the present invention to the via layer in the low k dielectric layers 48, the line-to-line capacitance is not compromised by the formation of the interconnect structure. Additional metalization layers can be created in the same manner as provided in FIGS. 2–11.

By providing an etching of copper to form copper lines with spaces therebetween, and subsequently depositing low k dielectric material in the spaces between the copper lines, damage to the low k dielectric material between the conductive lines caused by photoresist removal processes is avoided by the present invention. This increases the structural integrity of the device and allows improved performance of the integrated circuit chip.

Although the present invention has been described illustrated in detail, it needs to be clearly understood that the same is by way of illustration and example only and is not to be taken by way of limitation, the scope of the present invention being limited only by the terms of appended claims.

What is claimed is:

1. A method of forming a metal interconnect structure comprising the steps of:

etching a conductive layer to form conductive lines with spaces between the lines such that all photoresist material is removed during the etching of the conductive layer;

filling the spaces between the conductive lines and covering the conductive lines with low k dielectric material to form a low k dielectric layer;

depositing a polish layer over the low k dielectric layer and through the low k dielectric layer and polishing the polish layer;

etching via holes that extend through the polish layer and through the low k dielectric layer, the via holes being aligned over the conductive lines; and depositing a barrier layer over the conductive lines prior to filling the spaces between the conductive lines.

2. The method of claim 1, wherein the step of etching a conductive layer includes:

forming a hard mask over the conductive layer; patterning the hard mask with an opening; removing any photoresist material employed in patterning the hard mask; and applying an etchant to the conductive material through the opening in the hard mask to transfer the opening to the conductive layer and thereby form the conductive lines with the spaces between the conductive lines.

3. The method of claim 2, wherein the conductive material comprises copper or a copper alloy.

4. The method of claim 3, further comprising depositing conductive material into the via holes.

5. The method of claim 3, wherein the conductive material further comprises a first layer of tantalum or tantalum nitride, the copper or copper alloy on the first layer, and a second layer of tantalum or tantalum nitride.

6. The method of claim 5, wherein the etching of the conductive layer comprises exposing the conductive layer to $Cl_2/BCl_3$ at temperatures greater than approximately 200° C.

7. The method of claim 6, wherein the low k dielectric material is ultra low k dielectric material, with a k value less than or equal to approximately 2.5.

8. The method of claim 7, wherein the low k dielectric material is a porous low k dielectric material.

9. A method of forming a backend interconnect comprising the steps of:

etching a copper layer to form copper lines with spaces between the copper lines;

forming low k dielectric material in the spaces and over the copper lines;

etching via holes in the low k dielectric layer above the copper lines, while preventing the low k dielectric material in the spaces from exposure to photoresist removal process;

filling the via holes with copper; and depositing a barrier layer over the copper lines prior to filling the spaces between the copper lines.

10. The method of claim 9, wherein the step of etching the copper layer includes forming a photoresist mask over the copper layer, patterning the photoresist mask with an opening, etching the copper layer to form the copper lines with spaces between the copper lines, and removing the photoresist mask.

11. The method of claim 10, wherein the step of etching the copper layer further comprises etching a hard mask over the copper layer in accordance with the opening in the photoresist mask, and wherein the step of removing the photoresist mask is performed prior to etching the copper layer.

12. The method of claim 11, wherein the low k dielectric material is an ultra low k dielectric material, with a k value less than or equal to approximately 2.5.

* * * * *